United States Patent [19]
Brownlow et al.

[11] Patent Number: 5,923,512
[45] Date of Patent: Jul. 13, 1999

[54] FAULT TOLERANT CIRCUIT ARRANGEMENTS

[75] Inventors: Michael James Brownlow, Sandford on Thames; Andrew Kay, Oxford; Graham Andrew Cairns, Cuttleslowe; Toshio Nomura, Kidlington, all of United Kingdom

[73] Assignee: Sharp Kabushiki Kaisha, Osaka, Japan

[21] Appl. No.: 09/041,394

[22] Filed: Mar. 12, 1998

[30]     Foreign Application Priority Data

Mar. 15, 1997 [GB]   United Kingdom ................... 9705436

[51] Int. Cl.$^6$ ...................................................... H02H 3/18
[52] U.S. Cl. ................................ 361/78; 361/86; 324/770
[58] Field of Search ................................... 391/86, 78–79, 391/81, 87, 91, 56, 111; 324/522–523, 537, 765, 768, 769, 770

[56]             References Cited

U.S. PATENT DOCUMENTS

| | | | |
|---|---|---|---|
| 5,111,060 | 5/1992 | Asada ....................................... | 307/219 |
| 5,444,390 | 8/1995 | Bartlett et al. ........................... | 324/770 |
| 5,465,053 | 11/1995 | Edwards .................................. | 324/770 |

FOREIGN PATENT DOCUMENTS

| | | |
|---|---|---|
| 0588425 | 3/1994 | European Pat. Off. . |
| 0627722 | 12/1994 | European Pat. Off. . |

OTHER PUBLICATIONS

Search Report for Application No. GB 9705436.5; Dated Jun. 9, 1997.
Y. Takafuji et al., SID 93 Digest, pp. 383–386, 1993, "A 1.9–IN. 1.5–M Pixel Driver Fully–Integrated Poly–Si TFT–LCD for HDTV Projection".
C. Bolchini et al., 1994 IEEE International Symposium on Circuits and Systems, vol. 4 of 6, pp. 83–86, 1994, "CMOS Reliability Improvements Through a New Fault Tolerant Technique".
A.A. Sorensen, Electro–Technology, pp. 118–125, 1961, "Digital–Circuit Reliability Through Redundancy".
R.E. Kuehn, IEEE Transactions on Reliability, vol. R–18, No. 1, pp. 3–11, 1969, "Computer Redundancy: Design, Performance, and Future".

*Primary Examiner*—Michael J. Sherry

[57]             ABSTRACT

A fault tolerant circuit arrangement comprises a plurality of replicated non-redundant shift registers 30 connected in parallel and each having an enable/configuration input 31 and a plurality of outputs 36. Furthermore each register 30 includes a verify output 32 for outputting a verify signal indicating whether or not a fault condition is present within the register. The arrangement also includes a verification signal generator 33 for applying a fixed reference signal, a comparator 34 to which the verify signals from the outputs 32 are applied, and a control circuit 35. The test/control-logic of the comparator 34 and control circuit 35 is constructed using masking redundancy 20–24 in order to render the test/control logic tolerant to faults. The control circuit 35 serves to control testing of each of the registers 30 in turn by supplying an enable signal to the input 31 of each register 30 beginning with the first register. This causes the supply of a verify signal $V_1$ from the verify output 32 of the first register 30 to the comparator 34 which compares the verify signal $V_1$ to the reference signal. If the verify signal $V_1$ is significantly different from the reference signal, this indicates that there is a fault present in the first register, and the control circuit 35 is caused to supply a disable signal to the input 31 of the first register. The test procedure is repeated for each register 30 until a verify signal is received by the comparator 34 which indicates that there is no fault present in the associated register.

15 Claims, 10 Drawing Sheets

FAULT TOLERANT CIRCUIT ARRANGEMENTS

BACKGROUND OF THE INVENTION

1. Field of the Invention

This invention relates to fault tolerant circuit arrangements which may be used, for example, for the drive circuitry of active matrix liquid crystal displays (AMLCD).

2. Description of the Related Art

In recent years there has been considerable interest in the fabrication of integrated circuits on glass substrates using thin film transistors. The main reason for such interest has been the desire to integrate the drive circuitry of AMLCD's onto the glass substrate of the display itself. However such integration of the control circuitry can result in a decrease in the manufacturing yield caused by faults within the integrated drive circuitry. Such integrated drive circuitry is prone to failure as a result of its large area and inherent variation in the properties of the thin film transistors. Variations in parameters, such as the threshold voltage and mobility of the transistors, often manifest themselves as a soft failure caused by the inability of a particular transistor to match the performance of neighboring transistors in the same circuit. For these reasons, fault tolerant circuit design is becoming increasingly important both in AMLCD applications in order to increase the yield of the displays with integrated drive circuitry and also in other large area applications of thin film electronics.

A number of fault tolerant design techniques are already known. Redundancy-with-repair (RWR) involves duplicating the basic functional circuit and employing some means to effect a repair if one of the functional circuits is found to be faulty after manufacture. U.S. Pat. No. 5,111,060 (NEC Corporation) and Y. Takafuji et al, SID 93 Digest, pages 383–386 disclose the application of a RWR technique to AMLCD's. Furthermore FIG. 1 of the accompanying drawings shows a RWR circuit arrangement for the peripheral circuit of an AMLCD in which a number of basic functional circuits are duplicated to form shift register element pairs 1, 1a; 2, 2a; 3, 3a etc., with the spare shift register elements 1, 2, 3, etc. being connected between the associated circuit input and output by means of welding pads 4 and 5 in parallel with the shift register elements 1a, 2a, 3a etc. connected between the associated circuit input and output by means of cutting pads 6 and 7. Thus there is provision for completely removing a defective shift register element, such as 1a, from the circuit by irradiating the cutting pads 6 and 7 with a laser and welding in the replacement shift register element, such as 1, by means of the welding pads 4 and 5. Whilst RWR techniques can offer significant fault tolerance with reasonable overhead and negligible detrimental effect on circuit performance, there are many applications in which the low level test and repair steps of such a technique are too expensive to incorporate in the fabrication process.

Triple modular redundance (TMR) involves replicating the basic functional circuit in triplicate and connecting the outputs of the circuits 10, 11 and 12 to a common voting circuit 13 for producing an output corresponding to the majority vote of the outputs of the circuits 10, 11 and 12, as shown diagrammatically in FIG. 2 of the accompanying drawings. Such a technique is known from C. Bolchini et al, IEEE International Symposium on Circuits and Systems 1994, pages 83–86 and A. A. Sorenson "Digital circuit reliability through redundancy" Electro-Technology, 68, July 1961, pages 118–125. It will be appreciated that such a technique can be implemented by connecting the circuits 10, 11 and 12 to three AND gates driving a common OR gate. Such an arrangement is tolerant to a fault in any one of the three circuits 10, 11 and 12. However there is only a certain probability that such an arrangement will tolerate additional faults. Furthermore the technique is rendered costly by the provision of circuits in triplicate and by the associated decision logic. Furthermore the performance will be considerably inferior to a correctly functioning non-redundant circuit in terms of power consumption and speed, as a result of the additional load presented by the three parallel circuits and also the delay through the decision logic. For these reasons the TMR technique is not practicable for the decision circuits of AMLCD's which are essentially simple replicated circuits required to operate at high speed.

Another technique, which has not received as much attention in the literature, is Quad Masking (QM), such a technique being referred to by R. Kuen. "Computer redundancy:design, performance and future", IEEE Transactions on Reliability, Vol. R-18, No.1, February 1969, pages 3–11. As shown diagrammatically in FIG. 4 of the accompanying drawings, the QM technique involves connecting together four basic functional circuits 15, 16, 17 and 18 such that the circuits 15 and 16 are in series and the circuits 17 and 18 are in series, and the circuit pairs 15, 16 and 17,18 are connected in two parallel paths between a common input and output. Such a technique is considerably more robust than the TMR technique, and at least two of the circuits must fail to cause failure of the arrangement. The connection 19 shown by a broken line in FIG. 4 can be made according to the relative probabilities of occurrence of stuck open (non-conducting) and stuck closed (conducting) faults. If the arrangement is more likely to suffer from stuck open faults, the connection 19 is made since it gives another path through the arrangement. Although this technique is very robust, with only a modest area required for thin film MOS implementation, a circuit arrangement constructed with this type of logic will be considerably slower and will exhibit a higher power consumption than its non-redundant counterpart.

U.S. Pat. No. 5,465,053 discloses a circuit arrangement for driving an AMLCD, as shown diagrammatically In FIG. 3, comprising replicated shift registers of N stages split up into N/n shorter shift registers 70 and 71 each having n stages 72, these shorter shift registers being replicated k times (k=2 in the figure). Thus the circuit arrangement comprises N/n banks of k non-redundant registers each of length n. Furthermore the output of the final stage 72 of each of the shift registers 70, 71 forms ap input to a test/control circuit 73 at the end of each bank which performs a test procedure in which the inputs are compared to a test signal to determine which of the registers is functioning correctly. Furthermore the outputs from the stages 72 of the shift registers 70, 71 are connected to the active matrix by means of k input multiplexers 74 and driver circuits 75. In operation the test/control circuit 73 determines which of the registers 70, 71 is functioning correctly and selects an appropriate one of the registers 70, 71 which is working correctly for addressing of the AMCLD by controlling the multiplexers 74 so as to supply the outputs from the stages 72 of the selected register to the driver circuits 75.

The effectiveness of this type of redundancy, that is the probability that all N outputs from the driver circuits are correct, can be demonstrated by an analysis which assumes that each transistor performs as a simple digital switch with a probability of failure (either stuck open or stuck closed) equal to f, that the entire row within a bank is considered to have failed if any shift register stage within that row fails, that the entire bank is considered to have failed if there is a defect in the support circuitry in a particular bank, and that the entire circuit arrangement is considered to have failed if any bank fails. In this regard the support circuitry is considered to comprise the combination of the test control circuit 73 and the associated multiplexers 74 which each comprise conventional non-redundant TFT circuits.

With these assumptions, the following probabilities can be calculated:
The probability that one transistor works correctly is $$P(T_{ok})=1-f=g$$

The probability that one latch, with t transistors, is fault free is $$P(Latch_{ok})=g^t 32\ l$$

The probability that a register of an such latches is free from faults is given by:

$$P(Reg_{ok})=1^n=r$$

Therefore the probability that at least one of the k rows in a bank functions correctly is given by:

$$P(Row_{ok})=1-(l-r)^k=R$$

The probability that the n k-input multiplexers 74, each with m transistors, all work is given by:

$$P(Mult_{ok})=g^{nkm}=M$$

The probability that the test/control circuit 34, containing s transistors, is free from faults is given by:

$$P(Control_{ok})=g^k=C$$

Therefore each bank has the following probability of functioning correctly:

$$P(Bank_{ok})=P(Row_{ok}) \times P(Control_{ok}) \times P(Mult_{ok})=RCM$$

Finally the yield of the entire circuit arrangement comprising N/n such banks is given by:

$$P(Drive_{ok})=(RCM)^{N/n}$$

FIG. 3A shows the yield of the entire circuit arrangement plotted as a function of the number of stages in each bank n and the number of replicated registers in each bank k for a typical circuit arrangement in which the transistor failure rate f=0.01%, the number of columns N=800, the number of transistors per latch is 6, the number of transistors in the test/control circuit 73 is 17(k=2) and the number of transistors in each multiplexer 74 is 1. It is apparent from this graph that the redundant circuit arrangement of U.S. Pat. No. 5,465,053 has a number of limitations which would render the additional circuit complexity of such an arrangement unjustifiable in most applications. Compared with the yield of a corresponding non-redundant circuit arrangement of about 61% as shown in the figure, the best yield obtainable with the circuit arrangement of U.S. Pat. No. 5,465,053 is about 82% (for k=2 and n=50) at the expense of much increased circuit complexity. Furthermore there is very little benefit from increasing the number of rows in each bank since defects in the support circuitry have a significant impact on overall yield. Furthermore the test/control circuit 73 does not test for correct operation of the multiplexers 74.

SUMMARY OF THE INVENTION

It is an object of the invention to provide a circuit arrangement which is particularly tolerant to faults whilst substantially maintaining the performance of its non-redundant counterpart in terms of speed and power consumption.

According to the present invention there is provided a fault tolerant circuit arrangement comprising a plurality of replicated non-redundant functional circuits connected in parallel and each having an input and a plurality of outputs including a verify output test/control circuit means for detecting a verify signal outputted from the verify output of each circuit in response to an input signal applied to the input of the circuit, for comparing the verify signal to a reference signal to determine whether or not a fault is present in the circuit, and for selecting for functional operation one of the circuits tested which is shown by the corresponding verify signal to be free of a fault, wherein the test/control circuit means comprises circuit elements incorporating masking redundancy in order to render the test/control circuit means tolerant to faults.

Such a circuit arrangement can provide a self-adapting fault tolerant digital circuit architecture which operates at substantially similar speeds and power consumption to standard non-fault tolerant equivalent circuits, and can be implemented utilising highly reliable quad masking logic to perform self-test and power control of the functional circuits (whilst using standard non-redundant logic for the functional circuits themselves). The circuit arrangement is therefore particularly suitable for the implementation of integrated fault tolerant drive circuitry for AMLCD's.

In a preferred embodiment each of the functional circuits is a shift register having an enable input for receiving an input signal and a plurality of shift outputs in parallel for outputting a functional output signal. Preferably the verify output is constituted by one of the shift outputs of each shift register. Furthermore the test/control circuit means may be arranged to sequentially detect the verify signals from the circuits and to select for functional operation the first circuit tested which is shown by the corresponding verify signal to be free of a fault.

Conveniently the test/control circuit means may be arranged to apply a disable signal to the circuit in the event of the corresponding verify signal indicating that a fault is present in the circuit and to apply an enable signal to the next circuit in the sequence. Also a verification generator may be provided to supply the reference signal in response to receipt of an input signal.

The test/control circuit means may comprise a shift register which has a plurality of stages corresponding in number to said plurality of circuits and which is clocked so as to sequentially apply enable signals to the circuits until one of the circuits is shown to be free of a fault. Furthermore the test/control circuit means may be arranged to apply an enable signal to the circuit to supply the circuit with power and to cut off the power to the circuit in the event that the corresponding verify signal outputted by the circuit indicates that a fault is present in the circuit. In this case the outputs of the circuit may be connected to an OR gate in order to provide an output signal dependent on the output of the selected circuit and independent of the other circuits.

Preferably the test/control circuit selection means have a quad masking (QM) circuit architecture comprising four replicated circuit elements connected such that two pairs of elements are connected in parallel with the elements of each pair being connected in series. Most preferably a control element is connected between an interconnection point between the two elements of one pair of circuit elements and an interconnection point between the two elements of the other pair of circuit elements to control conduction between said interconnection points.

In order that the invention may be more fully understood, reference will now be made, by way of example, to the accompanying drawings.

DESCRIPTION OF THE PREFERRED EMBODIMENTS

Figures 5, 6:
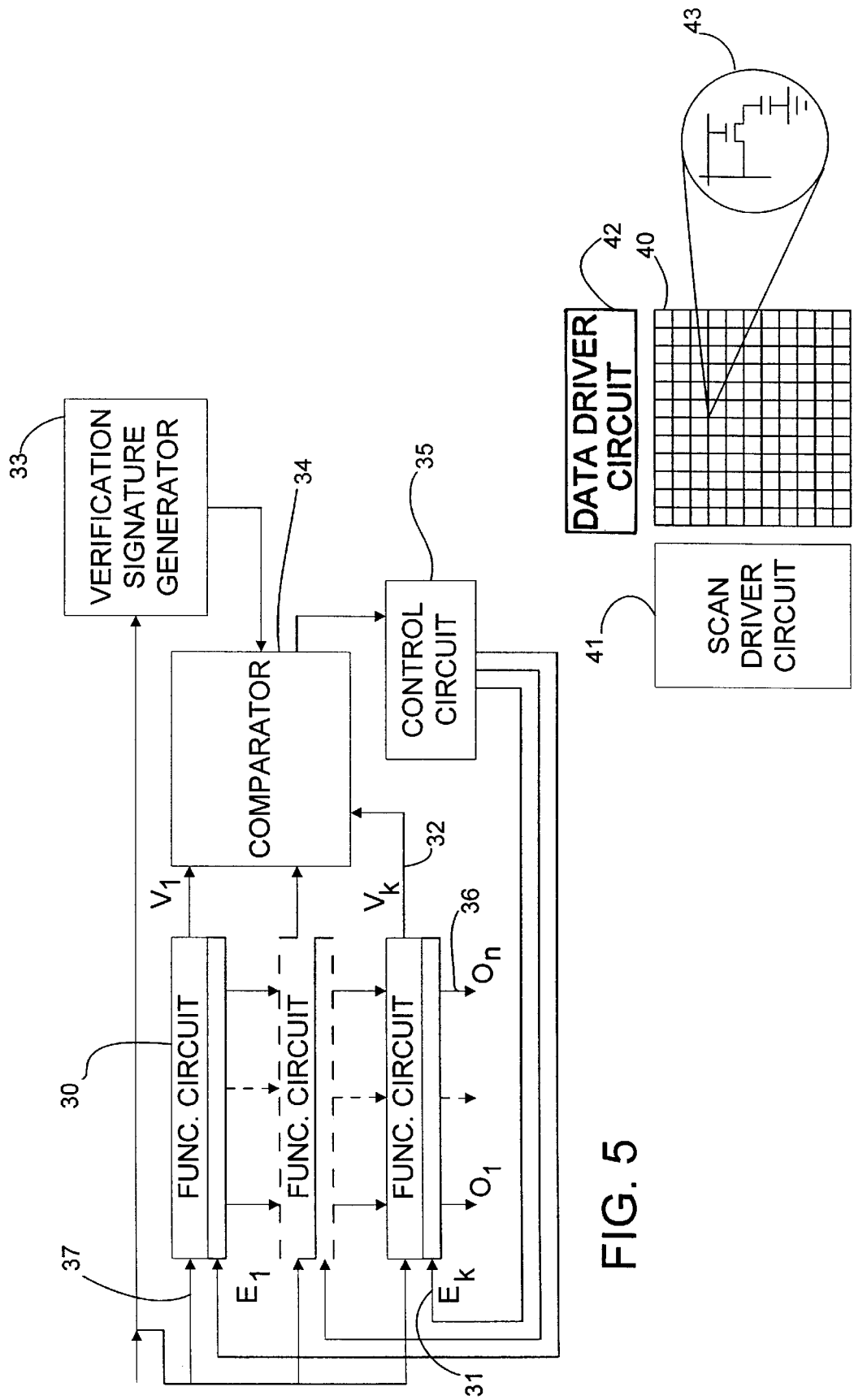
FIG. 5 is a diagram of a general circuit arrangement in accordance with the present invention.
FIG. 6 diagrammatically shows a typical AMLCD with integrated peripheral drive circuitry.

FIG. 5 shows a circuit arrangement in accordance with the present invention for driving an AMLCD (or for some other application) comprising a basic functional circuit 30 in the form of a shift register replicated k times with all the circuits being connected in parallel and each circuit having an enable/configuration input 31 for receiving an enable signal $E_1 \ldots E_k$ to render the circuit operational and a verify output 32 for outputting a verify signal $V_1 \ldots V_k$ indicating whether or not a fault condition is present within the circuit. The enable/cornfiguration input 31 may be connected to effect clocking and/or to supply power for the circuit, and must ensure that, when the circuit is not selected, all outputs default to either a low state or a high state. The circuit arrangement further incorporates a verification signature generator 33 for supplying a fixed reference signal, a comparator 34 to which the verify signals from the outputs 32 of the circuits 30 are supplied, and a control circuit 35 for supplying the enable signals to the enable/configuration inputs 31.

The control circuit 35 serves to control testing of each of the circuits 30 in turn by supplying an appropriate enable signal to the enable/configuration input 31 of each circuit 30 beginning with the first circuit. This causes the supply of a verify signal $V_1$ from the verify output 32 of the first circuit 30 to the comparator 34 which compares the verify signal $V_1$ to the fixed reference signal supplied by the verification signature generator 33. If the verify signal $V_1$ is significantly different from the reference signal, this indicates that there is a fault present in the first circuit, and the control circuit 35 is caused to supply a disable signal to the enable/configuration input 31 of the first circuit in order to render it non-operational, whilst at the same time supplying an appropriate enable signal to the enable/configuration input 31 of the next circuit 30 in order to repeat the test procedure for that circuit. The test procedure is repeated for each of the circuits 30 until a verify signal is received by the comparator 34 which indicates that there is no fault present in the associated circuit. At that point the test procedure is stopped and the corresponding circuit continues to be selected by the enable signal applied to its enable/configuration input 31 so that the circuit is operational for supply of output signals $O_o \ldots O_N$ at its outputs 36 in response to receipt of an input signal at its input 37.

Figure 4:
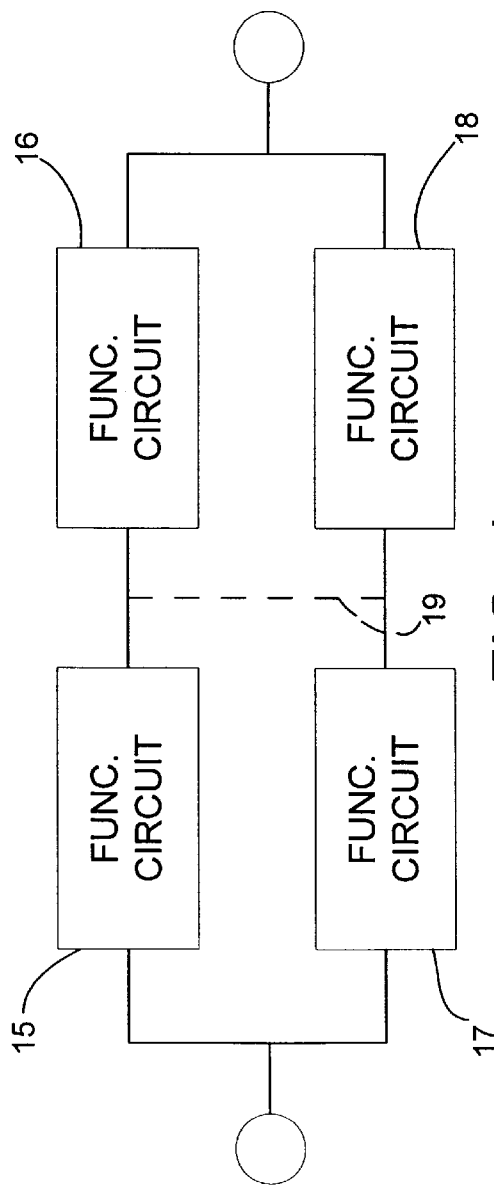
FIG. 4 is a diagram of a prior art QM circuit arrangement, FIG. 4A showing a possible implementation of QM at circuit level which may be utilised in a circuit arrangement in accordance with the present invention.
Figure 4A:
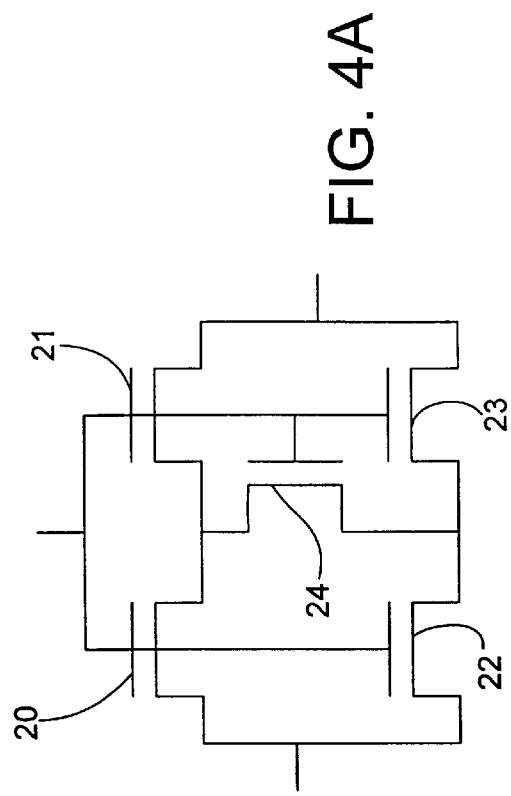

The test/control logic of the comparator 34 and control circuit 35 is constructed using the QM technique, and it is therefore possible to take advantage of the very high fault tolerance of the QM technique whilst avoiding the disadvantages of low speed and high power consumption since the test and selection functions need only run at a fraction of the speed of the functional circuits. A possible QM circuit design, suitable for thin-film transistor (TFT) MOS implementation, which may be used in this application is illustrated in FIG. 4A. In this case the central connection in a circuit arrangement consisting of four MOSFET's 20, 21, 22 and 23 is effected under control of a MOSFET 24. When the control signal is low the central connection is open in order to decrease the probability of conduction between the input and output whereas, when the control signal is high, the central connection is made in order to increase the probability of conduction between the input and output. This QM circuit is highly reliable and can be implemented by a particularly compact compound TFT structure.

The application of the fault tolerant circuit arrangement according to the present invention to integrated drive circuitry for AMLCD's will now be described. FIG. 6 diagrammatically shows a typical AMLCD matrix 40 with integrated scan and data driver circuits 41 and 42 in the form of shift registers for providing sample signals to each row of the matrix and timing signals for serial to parallel conversion of the video data. The detail 43 shows a typical active circuit for each pixel of the matrix 40.

Figure 7:
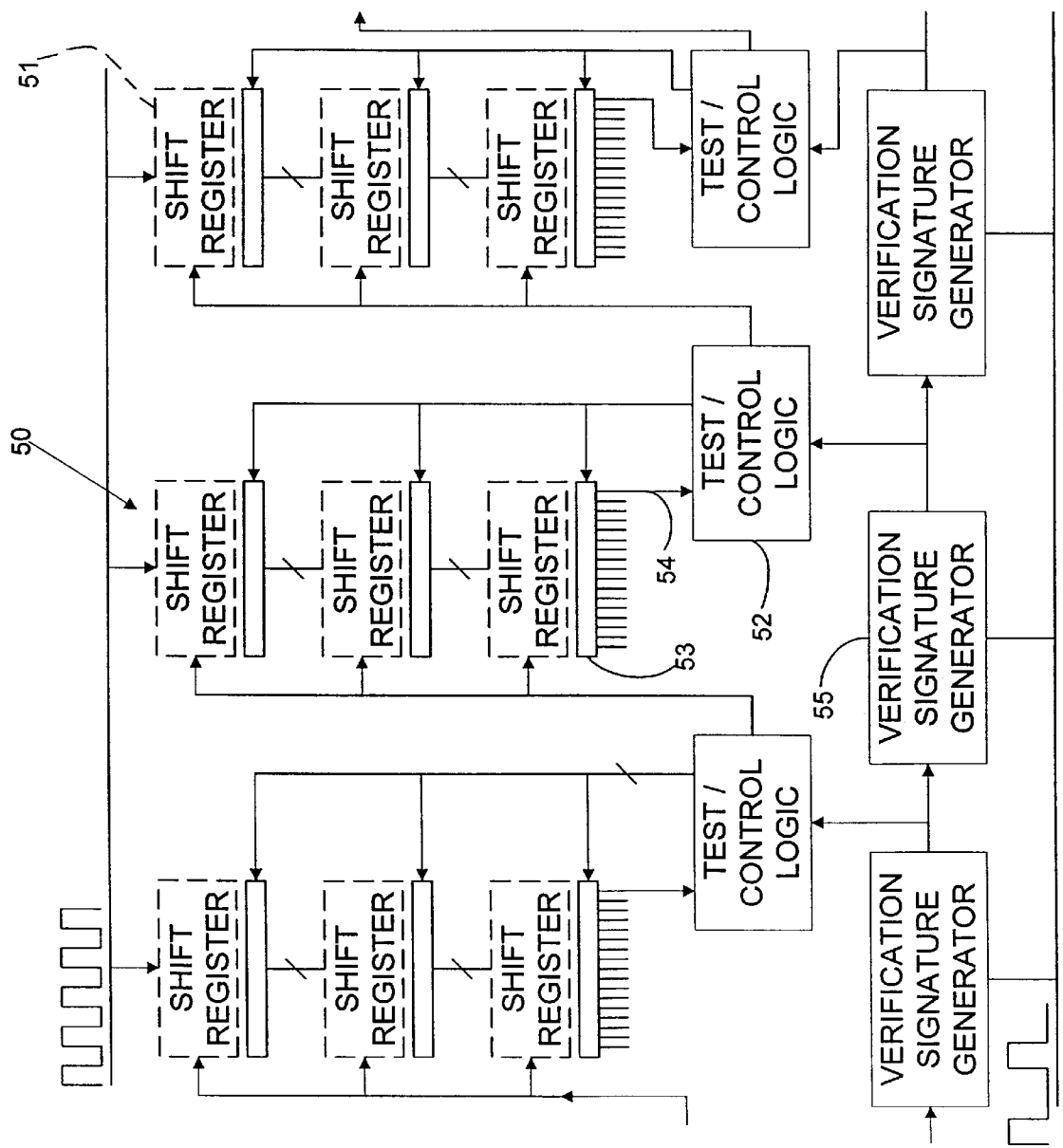
FIGS. 7, 8 and 9 are diagrams of various circuit arrangements in accordance with the present invention.

FIG. 7 shows a circuit arrangement for one of the AMLCD driver circuits, each driver circuit being in the form of a long shift register with N stages where N is typically of the order of 1000. The long shift register is divided into N/n shorter shift registers 50 each with n stages, and these shorter shift registers 50 consist of k registers 51 replicating one another. The registers 51 are shown in the figure in broken lines to indicate that they are implemented with standard logic circuitry. Thus the driver circuit consists of N/n banks of k non-redundant registers each of length n. Furthermore the functioning of each bank of registers 50 is controlled by test/control logic 52 constructed using the QM technique and arranged to supply enable/disable signals to the enable/configuration input 53 (which is implemented with QM logic) of each register 51 and to compare the verify signal outputted at the verify output 54 with the fixed reference signal supplied by a verification signature generator 55 in the form of a single stage shift register.

Figure 8:
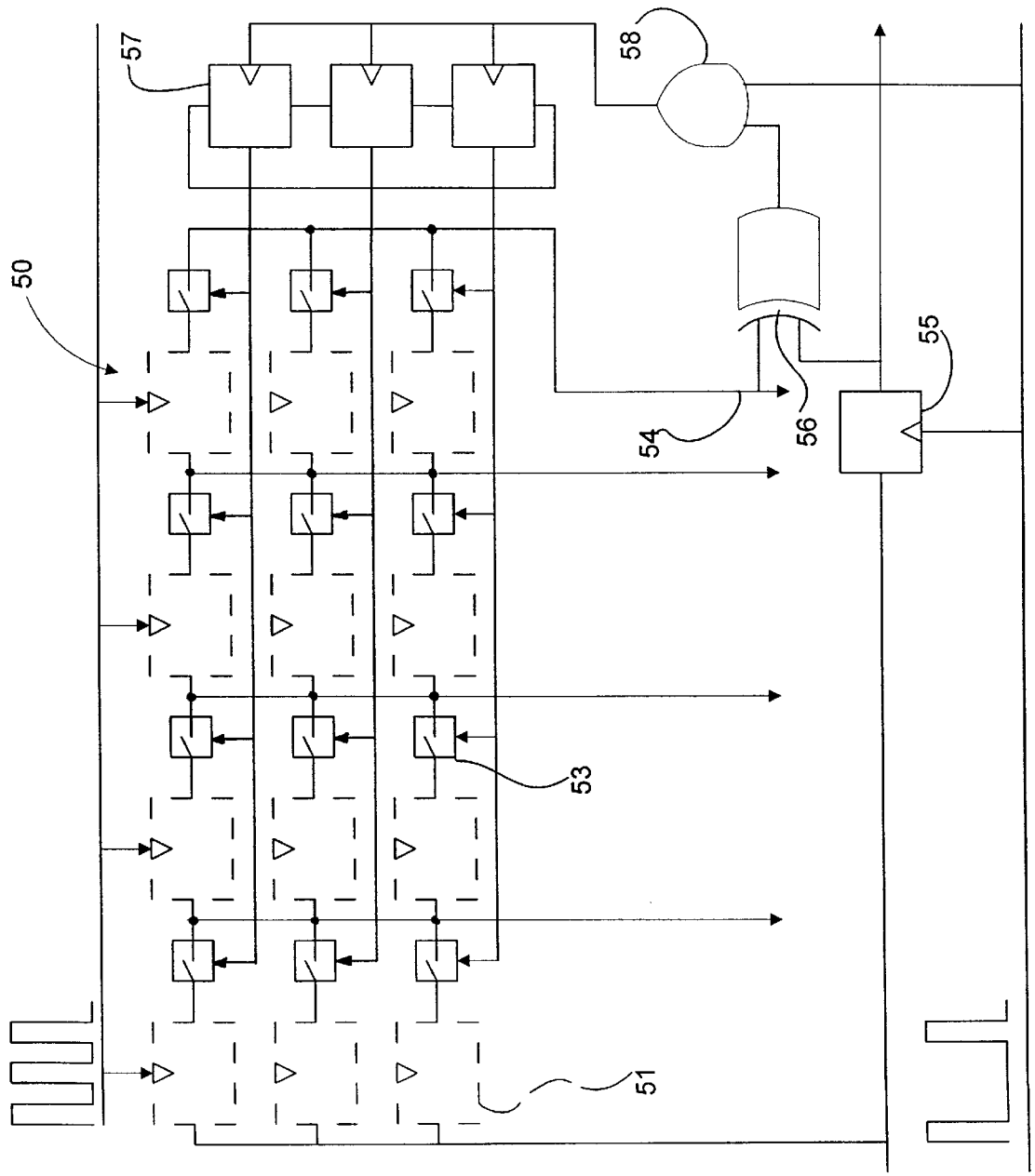

FIG. 8 shows the detail of the test/control logic used in such a circuit arrangement. In this case the verification signature generator 55 is provided by a single stage of a shift register provided with N/n stages, that is with one stage per bank of shift registers 50, which is clocked every n cycles of the master clock. The output signal from the verification signature generator 55 is supplied to an input of an EXOR gate 56 which compares the verify output 54 from the selected register 51 with the reference signal and which provides an output signal for controlling a shift register 57 of length k for supplying enable signals to the QM logic inputs 53 of the k registers 51 of each bank of registers 50. The QM logic inputs 53 are arranged to connect the k outputs of the ith stage of each register 51 to a common point which forms the bank output Oi for that stage and also the input to the following (i +1)th stage of each register 51. The verify output 54 of each of the n stage sift registers 51 is simply the nth stage output $O_n$ which is connected to the other input of the EXOR gate 56.

If the output of the EXOR gate 56 is high this indicates that there is disagreement between the verify signal and the reference signal from the verification signature generator 55 indicating a fault condition in the selected register 51, and a pulse is generated to clock the register 57 in order to disable the currently selected register 51 and enable the next available register 51 in the sequence. An AND gate 58 is provided intermediate the EXOR gate 56 and the register 57 for the purpose of synchronising clocking of the register 57. If the output signal of the EXOR gate 56 is low, this indicates that there is agreement between the verify signal and the reference signal indicating that the currently selected register 51 is considered to be free of a fault condition with the result that the register 57 is unclocked so that the currently selected register 51 is used for further operation of the circuit. The output signal from the verification signature generator 55 of the previous stage then provides the input signal to the next register bank 50. A significant advantage of such an arrangement is that all the outputs of the previous stage are tested by the QM logic of the next stage.

Figure 9:
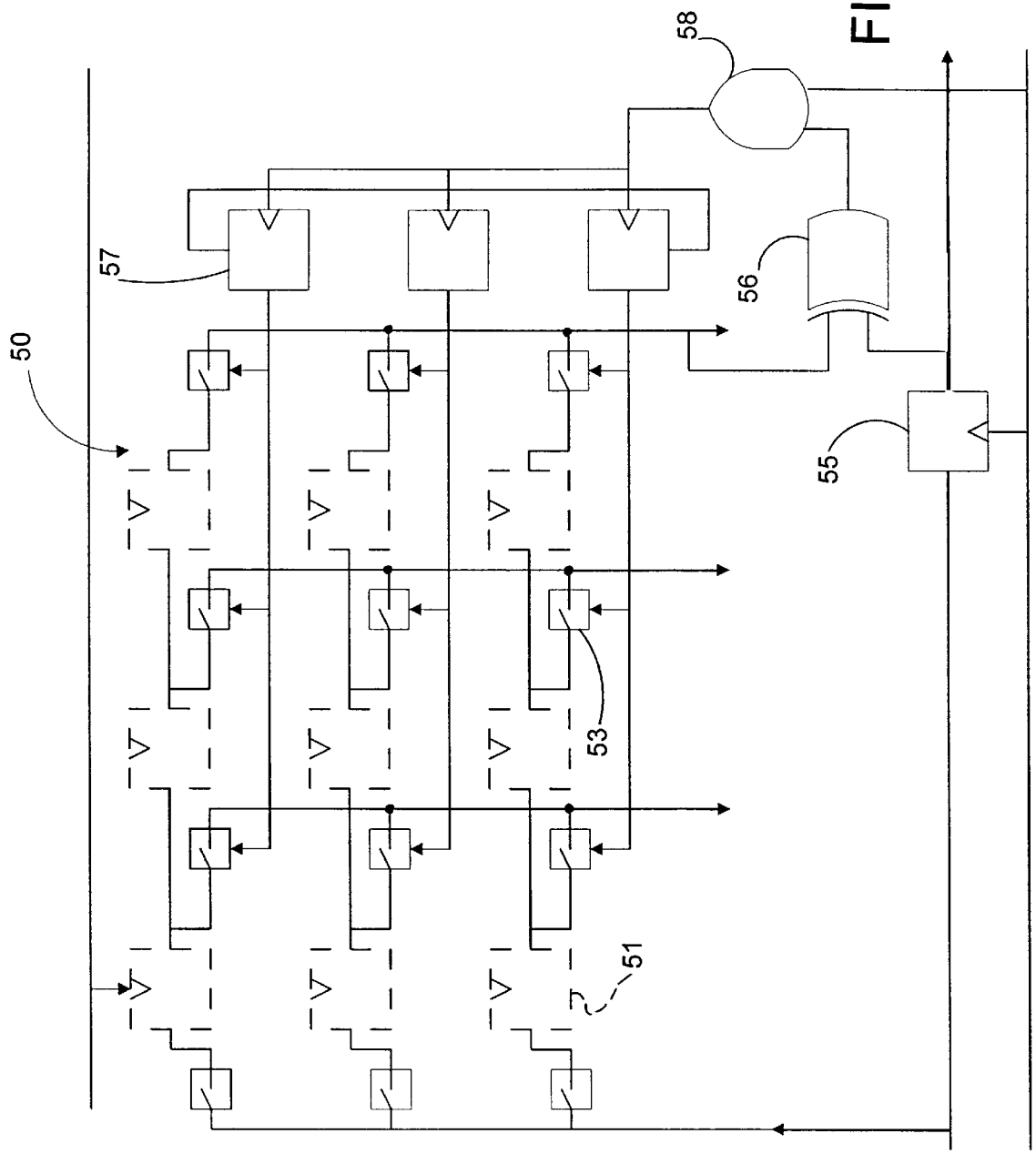

An alternative circuit arrangement is shown in FIG. 9 in which the corresponding outputs $O_{ik}$ of the k registers 51 are connected individually through the QM logic inputs 53 to the bank outputs $O_i$. This prevents loading of a stage in the currently selected register 51 by the other k −1 non-selected registers 51, although the enable logic inputs 53 and hence the $O_{1-n}$ outputs from each bank are not tested by the control logic. This alternative arrangement, although less reliable than the previous arrangements, may be faster for large k since there is reduced loading.

It will be noted that the circuit arrangements of FIGS. 8 and 9 require no explicit test signals to be generated, and that the arrangements are tolerant to a fault condition which might occur at any time after manufacture, perhaps as a result of stress in the thin film transistors.

Figure 10:
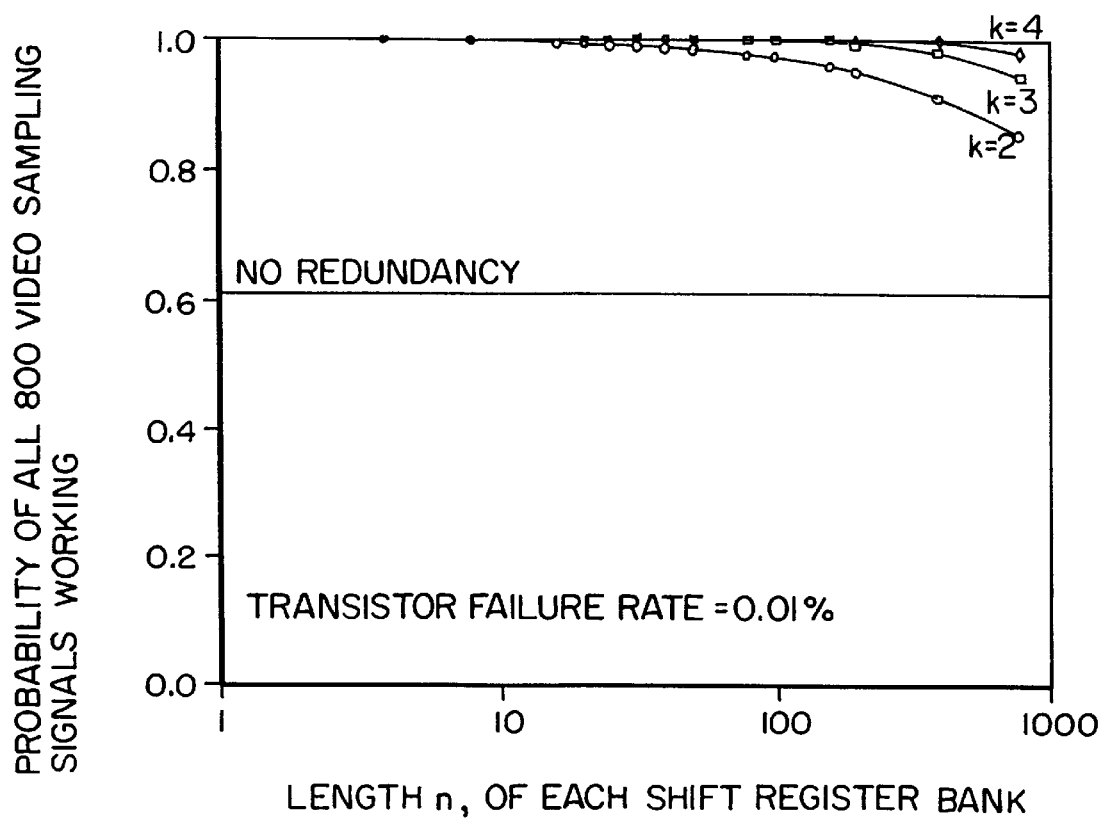
FIG. 10 is a graph showing the probability of the circuit arrangement in accordance with the present invention working correctly.

For the purposes of comparison of the yield of such a circuit arrangement according to the present invention with the yield of the circuit arrangement of U.S. Pat. No. 5,465,053, FIG. 10 shows a graph of the yield of the circuit arrangement of the present invention as a function of the number of stages n in each bank and the number k of replicated registers in each bank, utilising the same assumptions as for the graph of FIG. 3A, such as a transistor failure rate f=0.01%, the number of columns n=800, the number of transistors per latch is 6, the number of compound transistors in the test/control circuitry is 17 (k=2) and the number of compound transistors in the multiplexer is 1.

With these assumptions, the following probabilities can be calculated:
The probability that one transistor works correctly is $$P(T_{ok})=1-f=g$$

The probability that a QM compound transistor (as shown in FIG. 4A) works correctly is $$P(QT_{ok})=1-1.5f+0.5f=h$$

(which is considerably higher than for a single transistor). The probability that one latch, with t transistors, is fault free is $$P(Latch_{ok})=g^t=l$$

The probability that a register of n such latches is free from faults is given by:

$$P(Reg_{ok})=l^n=r$$

Therefore the probability that at least one of the k rows in a bank functions correctly is given by:

$$P(Row_{ok})=1-(1-r)^k=R$$

The probability that the n k-input multiplexers, each with m QM compound transistors, all work is given by:

$$P(Mult_{ok})=h^{nkm}=M$$

The probability that the test/control circuitry, containing s QM compound transistors, is free from faults is given by:

$$P(Control_{ok})=h^s=C$$

Therefore each bank has the following probability of functioning correctly:

$$P(Bank_{ok})=P(Row_{ok}) \times P(Control_{ok}) \times P(Mult_{ok})=RCM$$

Finally the yield of the entire circuit arrangement comprising N/n such banks is given by:

$$P(Driver_{ok})=(RCM)^{N/n}$$

Figure 1:
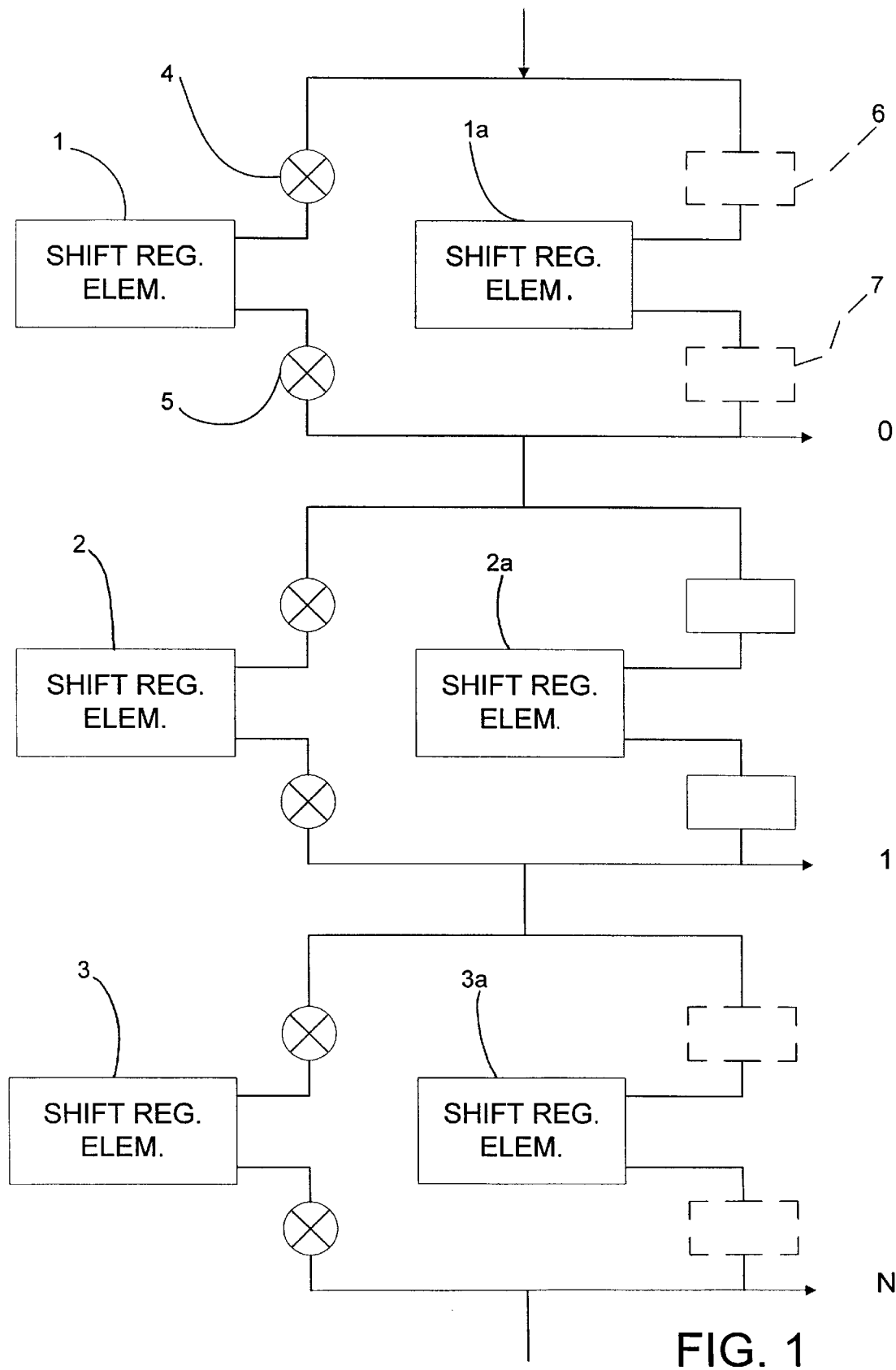
FIG. 1 is a diagram of a prior art RWR circuit arrangement for an AMLCD control circuit.
Figure 2:
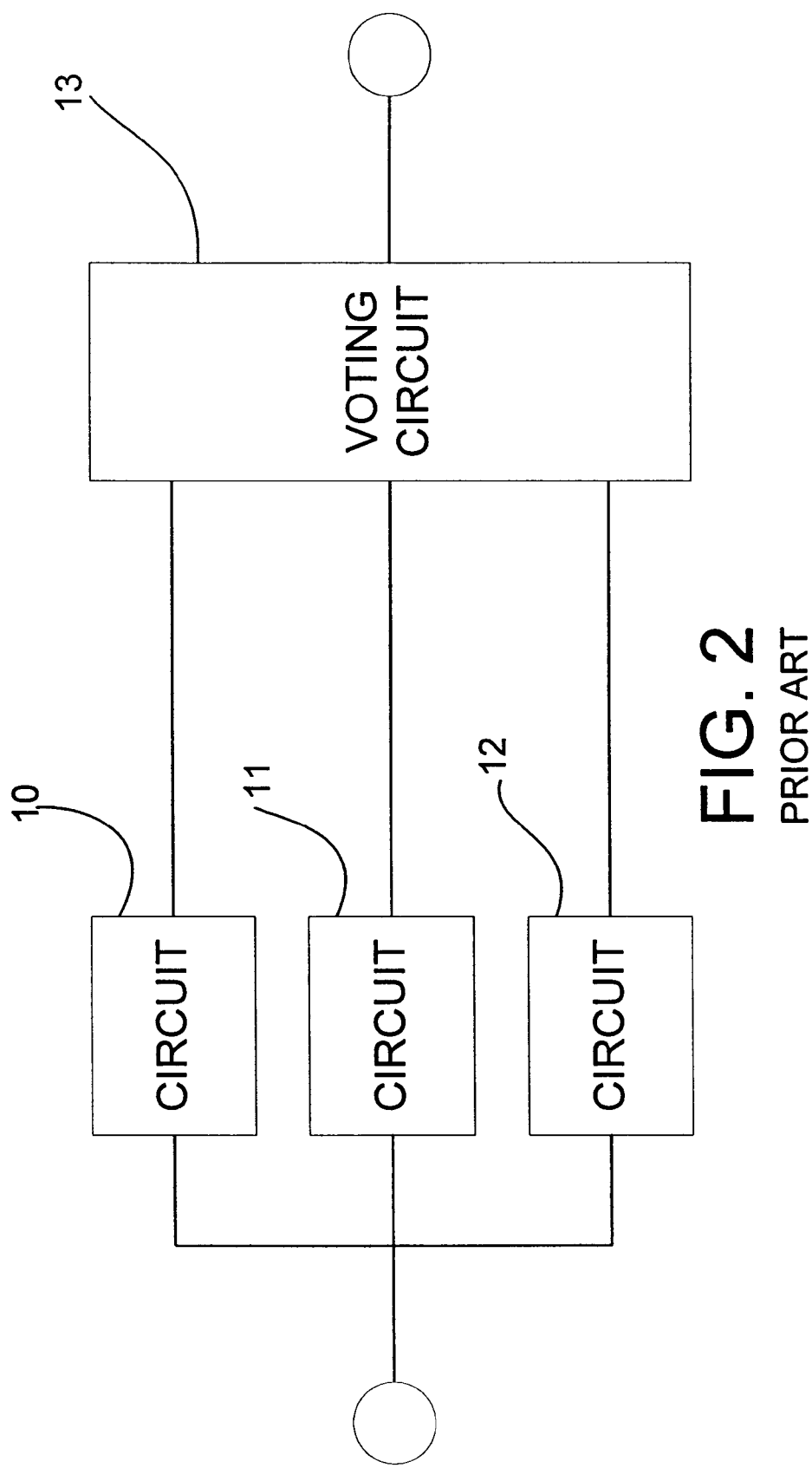
FIG. 2 is a diagram of a prior art TMR circuit arrangement.
Figure 3:
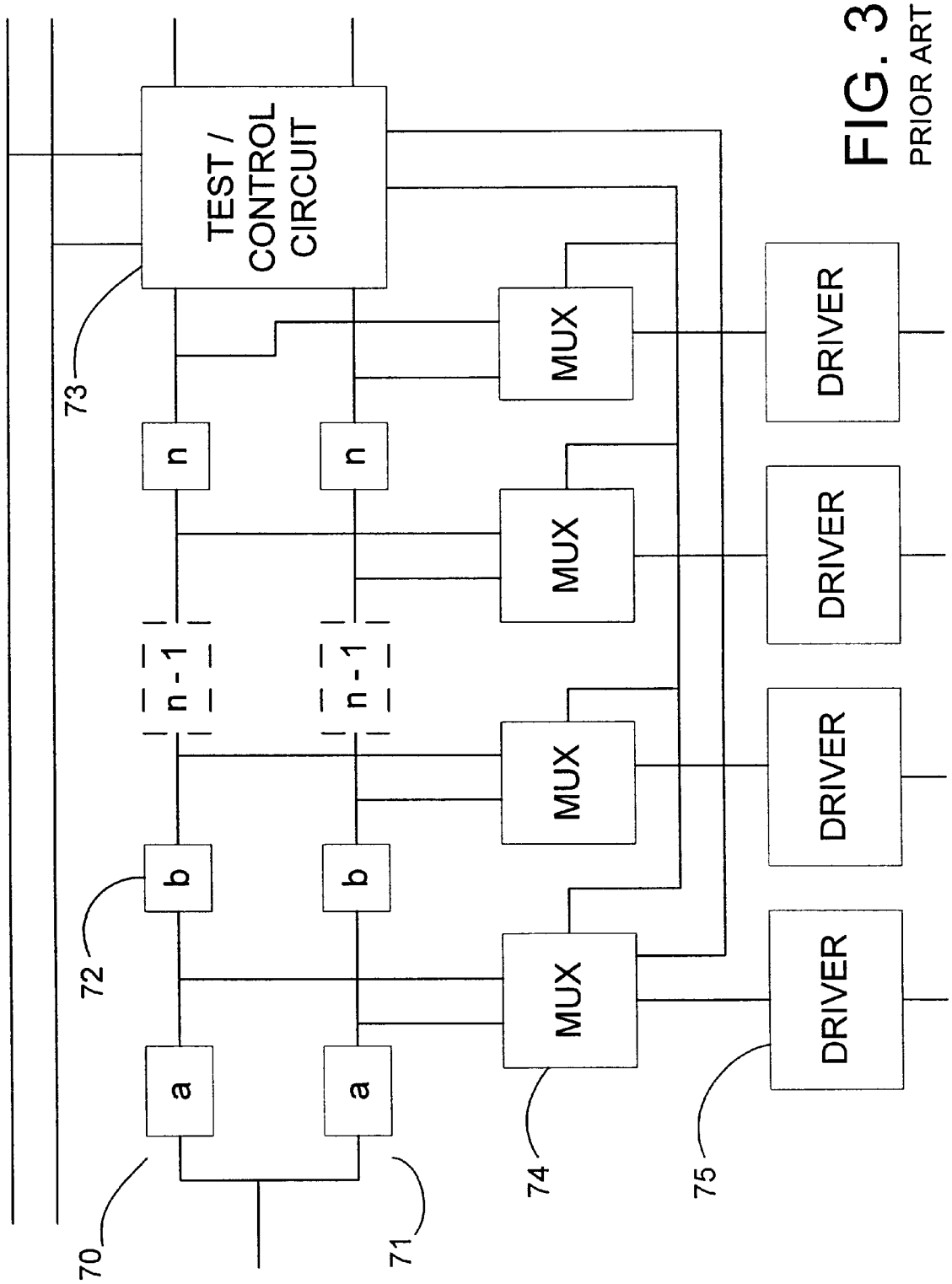
FIG. 3 is a diagram of a further prior art circuit arrangement, FIG. 3A being a graph showing the probability of such a circuit arrangement working correctly.
Figure 3A:
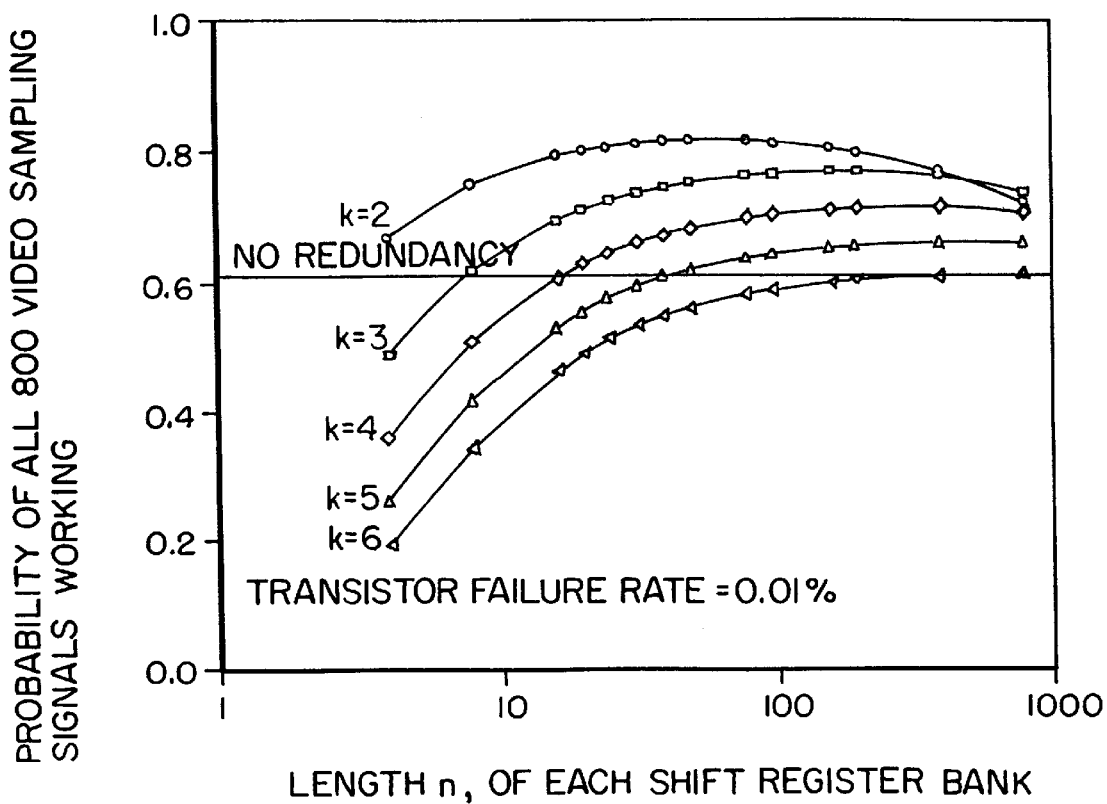

It will be seen from the graph of FIG. 10 that the yield of the circuit arrangement according to the present invention is considerably greater than the yield of 61% which might typically be expected with a non-redundant circuit arrangement. For example, for k=3 and n≦100, the yield is in excess of 99%. Furthermore, if a comparison is made with the graph of FIG. 3A showing the corresponding yield obtained with the circuit arrangement of U.S. Pat. No. 5,465,053, it will be appreciated that significantly greater yields are obtained for different values of k over a wide range of n utilising the circuit arrangement according to the present invention. Thus the circuit arrangement of the present invention gives far superior fault tolerance.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:
1. A fault tolerant circuit arrangement comprising:
a plurality of replicated functional circuits connected in parallel and each having an input and a plurality of outputs including a verify output; and
test/control circuit means for detecting a verify signal outputted from the verify output of each circuit in response to an input signal applied to the input of the circuit, for comparing the verify signal to a reference signal to determine whether or not a fault is present in the circuit, and for selecting for functional operation one of the circuits tested which is shown by the corresponding verify signal to be free of a fault,
wherein the test/control circuit means comprises circuit elements incorporating masking redundancy in order to render the test/control circuit means tolerant to faults.
2. A circuit arrangement according to claim 1, wherein each of the functional circuits is a shift register having an enable input for receiving an input signal and a plurality of shift outputs in parallel for outputting a functional output signal.

3. A circuit arrangement according to claim 2, wherein the verify output is constituted by one of the shift outputs of each shift register.

4. A circuit arrangement according to claim 1, wherein the test/control circuit means is arranged to sequentially detect the verify signals from the circuits and to select for functional operation the first circuit tested which is shown by the corresponding verify signal to be free of a fault.

5. An arrangement according to claim 1, wherein the test/control circuit means is arranged to apply a disable signal to the circuit in the event of the corresponding verify signal indicating that a fault is present in the circuit and to apply an enable signal to the next circuit in the sequence.

6. A circuit arrangement according claim 1, wherein a verification signature generator is provided to supply the reference signal in response to receipt of an input signal.

7. A circuit arrangement according to claim 1, wherein the test/control circuit means comprises a shift register which has a plurality of stages corresponding in number to said plurality of circuits and which is clocked so as to sequentially apply enable signals to the circuits until one of the circuits is shown to be free of a fault.

8. A circuit arrangement according to claim 1, wherein the test/control circuit means is arranged to apply an enable signal to the circuit to supply the circuit with power and to cut off the power to the circuit in the event that the corresponding verify signal outputted by the circuit indicates that a fault is present in the circuit.

9. A circuit arrangement according to claim 8, wherein the outputs of the circuit are connected to an OR gate in order to provide an output signal dependent on the output of the selected circuit and independent of the other circuits.

10. A circuit arrangement according to claim 1, wherein the test/control circuit means have a quad masking (QM) circuit architecture comprising four replicated circuit elements connected such that two pairs of elements are connected in parallel with the elements of each pair being connected in series.

11. A circuit arrangement according to claim 10, wherein a control element is connected between an interconnection point between the two elements of one pair of circuit elements and an interconnection point between the two elements of the other pair of circuit elements to control conduction between said interconnection points.

12. A circuit arrangement according to claim 11, wherein the control element is a MOSFET.

13. A liquid crystal display device comprising:

a matrix of pixels on a display substrate; and scan and data driver circuits for driving the matrix of pixels, wherein at least one of the scan and data driver circuits includes a fault tolerant circuit including:
a plurality of replicated functional circuits connected in parallel and each having an input and a plurality of outputs including a verify output; and test/control circuit means for detecting a verify signal outputted from the verify output of each circuit in response to an input signal applied to the input of the circuit, for comparing the verify signal to a reference signal to determine whether or not a fault is present in the circuit, and for selecting for functional operation one of the circuits tested which is shown by the corresponding verify signal to be free of a fault, wherein the test/control circuit means comprises circuit elements incorporating masking redundancy in order to render the test/control circuit means tolerant to faults.

14. A display device according to claim 13, wherein the at least one of the driver circuits comprising the fault tolerant circuit is fabricated on the display substrate.

15. A display device according to claim 13, wherein the fault tolerant circuit is implemented using thin film transistors (TFT).

* * * * *